US006825051B2

(12) United States Patent
AmRhein et al.

(10) Patent No.: US 6,825,051 B2
(45) Date of Patent: Nov. 30, 2004

(54) PLASMA ETCH RESISTANT COATING AND PROCESS

(75) Inventors: Fred AmRhein, Fountain Hills, AZ (US); Christophe Pomarede, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 39 days.

(21) Appl. No.: 10/150,989

(22) Filed: May 17, 2002

(65) Prior Publication Data

US 2003/0215963 A1 Nov. 20, 2003

(51) Int. Cl.$^7$ ............................................. H01L 21/00
(52) U.S. Cl. ...................................................... 438/9
(58) Field of Search ................................ 438/8, 9, 758

(56) References Cited

U.S. PATENT DOCUMENTS

| | | |
|---|---|---|
| 3,011,006 A | 11/1961 | Nicholson et al. |
| 3,874,919 A | 4/1975 | Lehman |
| 4,374,158 A | 2/1983 | Taniguchi et al. |
| 4,377,347 A | 3/1983 | Hanmyo et al. |
| 4,389,967 A | 6/1983 | Shimoda et al. |
| 4,428,975 A | 1/1984 | Dahm et al. |
| 4,499,354 A | 2/1985 | Hill et al. |
| 4,522,849 A | 6/1985 | Lewandowski |
| 4,592,307 A | 6/1986 | Jolly |
| 4,633,051 A | 12/1986 | Olson |
| 4,653,428 A | 3/1987 | Wilson et al. |
| 4,692,556 A | 9/1987 | Bollen et al. |
| 4,976,996 A | 12/1990 | Monkowski et al. |
| 4,978,567 A | 12/1990 | Miller |
| 4,984,904 A | 1/1991 | Nakano et al. |
| 5,027,746 A | 7/1991 | Frijlink |
| 5,065,698 A | 11/1991 | Koike |
| 5,104,514 A | 4/1992 | Quartarone |
| 5,129,958 A | 7/1992 | Nagashima et al. |
| 5,246,500 A | 9/1993 | Samata et al. |

(List continued on next page.)

FOREIGN PATENT DOCUMENTS

| | | |
|---|---|---|
| EP | 0 229 488 | 7/1987 |
| WO | WO 95/31582 | 11/1995 |
| WO | WO 97/06288 | 2/1997 |
| WO | WO 99/23276 | 5/1999 |

OTHER PUBLICATIONS

Moslehi et al., "Compositional Studies of Thermally Nitrided Silicon Dioxide (Nitroxide)", *J. Electrochem. Soc.*, vol. 132, No. 9, pp. 2189–2197 (Sep. 1985).

(List continued on next page.)

Primary Examiner—David Nelms
Assistant Examiner—Thao P. Le
(74) Attorney, Agent, or Firm—Knobbe, Martens, Olson & Bear, LLP

(57) ABSTRACT

A protective coating is provided herein and methods of using the protective coating for susceptors used in semiconductor deposition chambers are described. In the preferred embodiments, CVD chamber equipment, such as a susceptor, is protected from plasma etch cleaning. Prior to CVD of silicon nitride, the chamber equipment is first coated with an emissivity-stabilizing layer, such as silicon nitride. This layer is then superficially oxidized. After repeated cycles of deposited silicon nitride upon different substrates in sequence, the chamber is emptied of wafers and a plasma cleaning process is conducted. Plasma cleaning is preferably selective against the silicon oxynitride protective coating. After the plasma cleaning process, the emissivity-stabilizing layer is reapplied, oxidized, and a plurality of deposition cycles can commence again.

17 Claims, 4 Drawing Sheets

U.S. PATENT DOCUMENTS

| | | | |
|---|---|---|---|
| 5,271,967 A | 12/1993 | Kramer et al. | |
| 5,315,092 A | 5/1994 | Takahashi et al. | |
| 5,336,327 A | 8/1994 | Lee | |
| 5,360,269 A | 11/1994 | Ogawa et al. | |
| 5,421,893 A | 6/1995 | Perlov | |
| 5,456,761 A | 10/1995 | Auger et al. | |
| 5,474,618 A | 12/1995 | Allaire | |
| 5,493,987 A | 2/1996 | McDiarmid et al. | |
| 5,514,439 A | 5/1996 | Sibley | |
| 5,562,774 A * | 10/1996 | Breidenbach et al. | 118/715 |
| 5,571,333 A | 11/1996 | Kanaya | |
| 5,594,482 A | 1/1997 | Ohashi | |
| 5,728,629 A | 3/1998 | Mizuno et al. | |
| 5,788,799 A | 8/1998 | Steger et al. | |
| 5,798,016 A | 8/1998 | Oehrlein et al. | |
| 5,874,368 A | 2/1999 | Laxman et al. | |
| 5,902,407 A | 5/1999 | De Boer et al. | |
| 5,904,778 A | 5/1999 | Lu et al. | |
| 5,910,221 A | 6/1999 | Wu | |
| 6,056,823 A | 5/2000 | Sajoto et al. | |
| 6,066,209 A | 5/2000 | Sajoto et al. | |
| 6,071,573 A | 6/2000 | Koemtzopoulos et al. | |
| 6,120,640 A | 9/2000 | Shih et al. | |
| 6,129,808 A | 10/2000 | Wicker et al. | |
| 6,170,429 B1 | 1/2001 | Schoepp et al. | |
| 6,214,425 B1 | 4/2001 | Spinelli et al. | |
| 6,227,140 B1 | 5/2001 | Kennedy et al. | |
| 6,325,857 B1 | 12/2001 | Miyoshi | |
| 6,325,858 B1 | 12/2001 | Wengert et al. | |
| 6,342,691 B1 | 1/2002 | Johnsgard et al. | |
| 2001/0001954 A1 * | 5/2001 | Urabe | 118/728 |
| 2002/0096115 A1 * | 7/2002 | Urabe | 118/728 |
| 2003/0035905 A1 * | 2/2003 | Lieberman et al. | 427/569 |

OTHER PUBLICATIONS

Murarka et al., "Thermal Nitridation of Silicon in Ammonia Gas: Composition and Oxidation Resistance of the Resulting Films", *J. Electrochem. Soc.*, vol. 126, No. 6, pp. 996–1003 (Jun. 1978).

Linke et al., "Behavior of Boron–Doped Graphites, Plasma–Sprayed $B_4C_1$ and a–C/B:H as Plasma–Facing Materials," *Fusion Technology*, vol. 20, Sep. 1991, pp. 227–230.

Ponnekanti et al., "Failure mechanisms of anodized aluminum parts used in chemical vapor deposition chambers," *J. Vac. Sci. Technol*, vol. 14, No. 3, May/Jun. 1996, pp. 1127–1131.

* cited by examiner

PLASMA ETCH RESISTANT COATING AND PROCESS

FIELD OF THE INVENTION

The present invention relates in general to a plasma etch resistant coating on susceptors, and more specifically to a protective coating for susceptors used in semiconductor deposition chambers, and methods of using the same.

BACKGROUND OF THE INVENTION

In the generation of semiconductor devices, such as devices designed for memories and microprocessors, various thin films are deposited onto a semiconductor substrate. These thin films include dielectric films. Examples include silicon nitride (SiN), which is used among other things as an oxidation-resistant masking film, and silicon dioxide (SiO), which is used among other things as a passivation film.

High-temperature ovens, called reactors, are used to generate semiconductor substrates. For such a process, one or more substrates, such as silicon wafers, are placed on a wafer support inside the reaction chamber. Both the wafer and support are heated to a desired temperature. Wafer supports that aid in absorbing radiant heat are known as susceptors. In a typical wafer treatment step, reactant gases are passed over the heated wafer, causing the chemical vapor deposition (CVD) of a thin layer on the wafer. Various process conditions, particularly temperature uniformity and reactant gas distribution, must be carefully controlled to ensure a high quality of the resulting layers.

Susceptors are typically formed of silicon carbide (SiC)-coated graphite components that can be additionally coated to stabilize emissivity. For example, in order to have uniform thermal behavior during substrate processing, components in a SiN deposition tool can be additionally coated, prior to processing of the substrates, with silicon nitride. The initial SiN coating on the susceptor causes the susceptor emissivity, which affects temperature control, to be roughly the same at the beginning and end of a run, despite continued SiN build-up on the susceptor as SiN is deposited on a plurality of wafers in series.

Thus, in a typical process run for a SiN CVD reactor, a susceptor is introduced into the chamber, the susceptor is coated with silicon nitride in the chamber, and then wafers are introduced sequentially for deposition of silicon nitride on the wafers. Between wafers, or after several wafers are processed, a plasma clean step is conducted to remove deposits that are left on the walls of the chamber and also on the susceptor.

During the cleaning and removal of SiN deposits, the underlying SiC tends to get damaged. Accordingly, a need exists for an improved coating for protection of semiconductor components.

SUMMARY OF THE INVENTION

In accordance with one aspect of the present invention, a susceptor comprising a silicon oxynitride coating is provided for a semiconductor reactor configured for plasma etch processing.

In accordance with another aspect of the present invention, a method of preparing a wafer holder for deposition is provided. The method includes introducing the wafer holder into the chamber, coating the wafer holder with a primary coating of silicon nitride in the chamber, and oxidizing the primary silicon nitride coating on the wafer holder prior to processing of wafers.

In the illustrated embodiments, the susceptor is a SiC-coated graphite susceptor, and the reactor is configured for silicon nitride deposition. The primary coating of silicon nitride is formed by thermal CVD and preferably has a thickness between about 500 Å and 2.0 μm. Oxidizing of the primary silicon nitride coating comprises flowing an oxygen source selected from the group consisting of oxygen, nitric oxide, and nitrous oxide. Oxidizing preferably forms between about 5 Å and 200 Å of silicon oxynitride.

In one preferred embodiment, oxidizing comprises non-uniformly oxidizing the primary silicon nitride coating. Non-uniformly oxidizing can comprise employing an inert gas to direct an oxygen source non-uniformly over the wafer holder and/or adjusting temperature offsets. After one or more cycles of silicon nitride deposition, the reactor is configured for plasma cleaning of reactor surfaces.

In another aspect, a process is provided for using an oxidized silicon nitride coating to protect a susceptor from plasma cleaning of excess silicon nitride after at least one cycle of wafer processing.

In another aspect, a method of processing semiconductor substrates comprising preparing a susceptor by providing a primary coating on the susceptor and oxidizing the primary coating prior to processing of substrates. A substrate is loaded onto susceptor, followed by depositing silicon nitride onto the substrate. The silicon nitride coated substrate is removed from the susceptor. The susceptor is then subjected to plasma cleaning for removal of silicon nitride from the depositing. In a preferred embodiment, the primary coating comprises silicon nitride and multiple substrates are coated with silicon nitride in sequence before plasma cleaning. The coating serves to protect the susceptor used in semiconductor reactors from the plasma cleaning process.

In the illustrated embodiments, the oxidized silicon nitride layer that overlies the silicon carbide coating on the chamber components provides superior etch selectivity, as compared to etching SiN over SiC. This has been found particularly advantageous where the coatings are preferentially attacked in various areas due to non-uniform distribution of cleaning radicals in the reactor chamber.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENTS

Methods for Carrying Out the Invention

While the preferred embodiments are presented in the context of a single-substrate, horizontal flow cold-wall reactor, it will be understood that certain aspects of the invention will have application to reactors of other types. The illustrated single-pass horizontal flow design enables laminar flow of reactant gases with low residence times, which in turn facilitates sequential processing while minimizing reactant interaction with each other and with chamber surfaces. Thus, among other advantages, such laminar flow enables sequentially flowing reactants that might react with each other. While advantageous, such design can also result in non-uniformities. The skilled artisan will recognize, however, that the protective coating and processes described herein will have utility for other reactor designs.

Similarly, while the embodiments have particular utility in the context of CVD chambers employing periodic cleaning etch cycles, the skilled artisan will appreciate that the principles and advantages described herein have application to wafer supports for semiconductor tools conducting other processes.

As noted in the Summary section above, plasma etch cleaning processes have been found to preferentially attack various areas of the semiconductor chamber and components. In order to provide a coating for the chamber and components that is less prone to attack by the radical chemistry of the cleaning process, the preferred embodiments provide a protective coating. One embodiment of the present invention provides, as set forth in detail below, a silicon oxynitride coating and methods of using such a coating.

Prior to describing the processes in greater detail, the preferred reactor for depositing silicon-containing conductive layers by CVD is first described below.

Preferred Reactor

The preferred embodiments are presented in the context of a single-substrate, horizontal flow cold-wall reactor. "Single wafer" processing tools, in general, demonstrate greater process control and uniformity than traditional batch systems, but do so at the expense of throughput, since only one or at best a handful of substrates can be processed at one time. The illustrated single-pass horizontal flow design also enables laminar flow of reactant gases, with low residence times, which in turn facilitates sequential processing while minimizing reactant interaction with each other and with chamber surfaces. Thus, among other advantages, such a laminar flow enables sequentially flowing reactants that might adversely react with each other. Reactions to be avoided include highly exothermic or explosive reactions, such as produced by oxygen and hydrogen-bearing reactants, and reactions that produce particulate contamination of the chamber.

Figure 1:
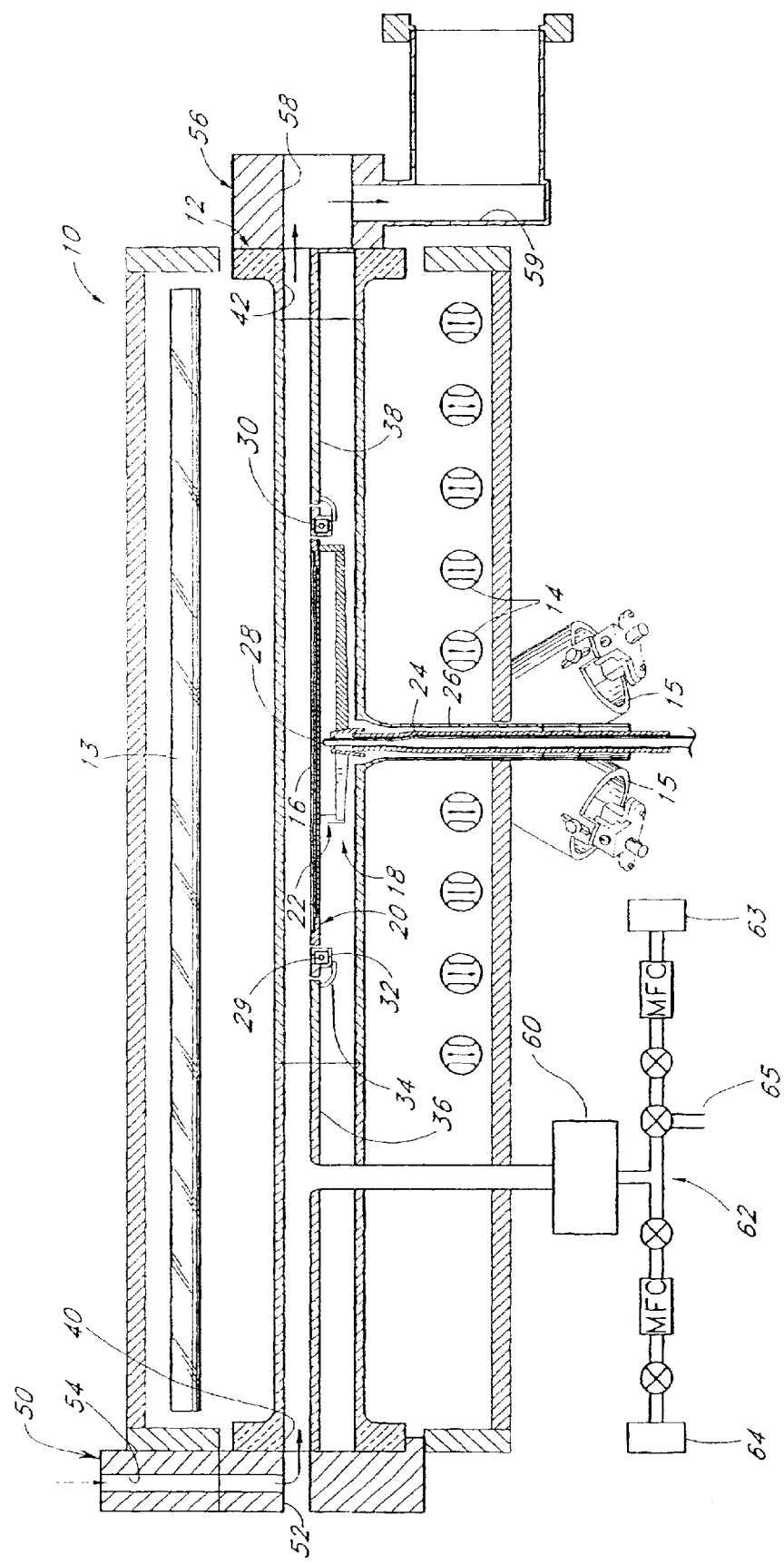
FIG. 1 is a schematic sectional view of an exemplary single-substrate reaction chamber for use with the preferred embodiments.

FIG. 1 shows a chemical vapor deposition (CVD) reactor 10, including a quartz process or reaction chamber 12, constructed in accordance with a preferred embodiment, and for which the methods disclosed herein have particular utility. While originally designed to optimize epitaxial deposition of silicon on a single substrate at a time, the inventors have found the superior processing control of the illustrated reactor 10 to have utility in CVD of a number of different materials. Moreover, the illustrated reactor 10 can safely and cleanly accomplish multiple treatment steps sequentially in the same chamber 12. The basic configuration of the reactor 10 is available commercially under the trade name Epsilon™ from ASM America, Inc. of Phoenix, Ariz.

A plurality of radiant heat sources are supported outside the chamber 12 to provide heat energy in the chamber 12 without appreciable absorption by the quartz chamber 12 walls. The preferred embodiments are thus described in the context of a "cold wall" CVD reactor for processing semiconductor wafers. As described in more detail below, stable emissivity behavior of the system during processing is helpful in maintaining temperature uniformity.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates (not shown) above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A workpiece or substrate, preferably comprising a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, the principles and advantages described herein apply equally well to depositing layers over numerous other types of substrates, including, without limitation, glass substrates such as those employed in flat panel displays.

The illustrated support structure 18 includes a substrate holder 20, upon which the wafer 16 rests, and a support spider 22. The spider 22 is mounted on a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors may take any of a variety of forms, such as optical pyrometers or thermocouples. The number and positions of the temperature sensors are selected to promote temperature uniformity. Preferably, the temperature sensors directly or indirectly sense the temperature of positions in proximity to the wafer.

In the illustrated embodiment, the temperature sensors comprise thermocouples, including a first or central thermocouple 28, suspended below the substrate holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples is housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss at substrate edges, a phenomenon which is known to occur due to a greater ratio of surface area to volume in regions near such edges. By minimizing edge losses, the slip ring 32 can reduce the risk of radial temperature non-uniformities across the wafer 16. The slip ring 32 can be suspended by any suitable means. For example, the illustrated slip ring 32 rests upon elbows 34 that depend from a front chamber divider 36 and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the substrate support structure 18 positioned between the inlet 40 and the outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully below, and communicates such gases with the slot 52 and the inlet port 40. The inlet 54 can include gas injectors as described in U.S. Pat. No. 5,221,556, issued Hawkins et al., or as described with respect to FIGS. 21–26 in U.S. Pat. No. 6,093,252, issued Jul. 25, 2000, the disclosures of which are incorporated herein by reference. Such injectors are designed to maximize uniformity of gas flow for the single-wafer reactor.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber (not shown). A pump or fan is preferably included to aid in drawing process gases through the chamber 12, and to evacuate the chamber for low pressure processing.

The reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TRW-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. A source of carrier gas 64 is also coupled to the gas line 62. One or more further branch lines 65 can also be provided for additional reactants. As is known in the art, the gas sources 63, 64 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the excited species generator 60 and thence into the reaction chamber 12. It will be understood that, in other arrangements, the excited species can be generated within the process chamber. The preferred processes described below employ excited species for chamber and component cleaning steps after one or more deposition cycles, and can also employ excited species for plasma assisted CVD.

Wafers are preferably passed from a handling chamber (not shown), which is isolated from the surrounding environment, through the slot 52 by a pick-up device. The handling chamber and the processing chamber 12 are preferably separated by a gate valve (not shown) of the type disclosed in U.S. Pat. No. 4,828,224, the disclosure of which is hereby incorporated herein by reference.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 36, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer processing chamber 12 of the illustrated type, but for 300 mm wafers, preferably has a capacity of less than about 100 liters, more preferably less than about 60 liters, and most preferably less than about 30 liters. One 300 mm wafer processing chamber has a total volume of about 24 liters, with an effective processing gas capacity of about 11.83 liters.

Figure 2:
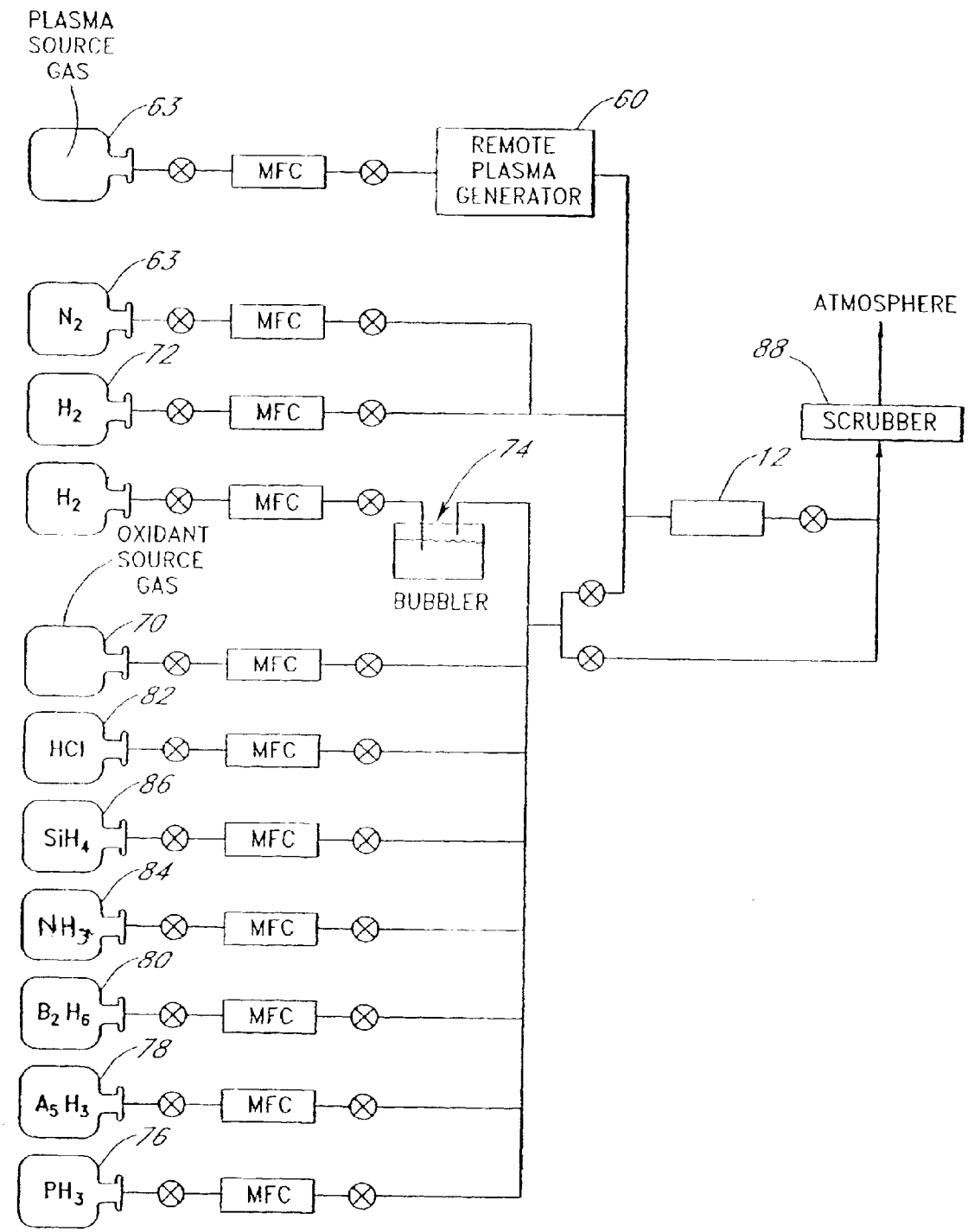
FIG. 2 is a gas flow schematic, illustrating reactant and purge gas sources connected to the reaction chamber in accordance with a preferred embodiment of the present invention.

FIG. 2 shows a gas line schematic, in accordance with the preferred embodiment. The reactor 10 is provided with a source 70 of oxidizing agent or oxidant. The oxidant source 70 can comprise any of a number of known oxidants, particularly a volatile oxidant such as $O_2$, NO, $H_2ON_2O$, HCOOH, $HClO_3$. $O_2$, $N_2O$ or NO is most preferably employed. Preferably, the oxidant is introduced in an inert carrier gas flow, such as $H_2$ or $N_2$. In other arrangements, pure reactant flows can also be used. In still other arrangements, an oxygen-containing source gas can be provided through the remote plasma generator 60 to provide excited species for oxidation. Preferably, the oxidant source gas is stored in a safe (non-explosive) mixture.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition. For example, $H_2$ is also employed in a high temperature hydrogen bake to sublimate native oxide prior to layer formation or bare silicon. $H_2$ can also flow through the excited species generator 60 to generate H radicals for similar surface preparation.

The preferred reactor 10 also includes a source 63 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

A liquid reactant source 74 is also shown. The liquid source 74 can comprise, for example, liquid dichlorosilane (DCS), trichlorosilane (TCS), or metallorganic sources in a bubbler, and a gas line for bubbling and carrying vapor phase reactants from the bubbler to the reaction chamber 12.

Desirably, the reactor 10 will also include other source gases such as dopant sources (e.g., the illustrated phosphine 76, arsine 78 and diborane 80 sources) and etchants for cleaning the reactor walls and other internal components (e.g. HCl source 82 or $NF_3/Cl_2$ as the plasma gas source 63 to be provided through the excited species generator 60). While not shown, a source of germanium (e.g., germane or $GeH_4$) can also be provided for doping or formation of SiGe films.

Additional illustrated source gases include an ammonia ($NH_3$) source 84, which serves as a volatile nitrogen source, useful in CVD and nitridation anneal steps, as will be apparent from the description. A silane source 86 is also provided. As is known in the art, silanes, including monosilane ($SiH_4$), DCS and TCS, are common volatile silicon sources for CVD applications, such as the deposition of silicon nitride, metal silicides, and extrinsic or intrinsic silicon (polycrystalline, amorphous or epitaxial, depending upon deposition parameters). Monosilane is particularly preferred to avoid chlorine incorporation into sensitive integrated circuit structures.

Referring back to FIG. 1, each of the gas sources may be connected to the inlet 54 (FIG. 1) via gas lines with attendant safety and control valves, as well as mass flow controllers ("MFCs"), which are coordinated at a gas panel. Process gases are communicated to the inlet 54 (FIG. 1) in accordance with directions programmed into a central controller and distributed into the process chamber 12 through injectors. After passing through the process chamber 12, unreacted process gases and gaseous reaction by-products are exhausted to a scrubber to condense environmentally dangerous fumes before exhausting to the atmosphere.

In addition to the conventional gas sources and liquid bubblers, discussed above, the preferred reactor 10 includes the excited species source 60 positioned remotely or upstream of the reaction chamber 12. The illustrated source 60 couples microwave energy to gas flowing in an applicator, where the gas includes reactant precursors from the reactant source 63. A plasma is ignited within the applicator, and excited species are carried toward the chamber 12. Preferably, of the excited species generated by the source 60, overly reactive ionic species substantially recombine prior to entry into the chamber 12. On the other hand, neutral radicals such as F and Cl survive to enter the chamber 12 and react as appropriate.

As will be clear from the present discussion, since energy is distributed along with the excited species, rather than solely through separate heating mechanisms, uniformity of plasma etch species is difficult to maintain, particularly with the illustrated upstream excited species generator 60 position. Accordingly, the preferred embodiments provide protection to the susceptor against damage during such plasma cleaning.

Silicon Oxynitride Coating and Methods of Use

Figure 3:
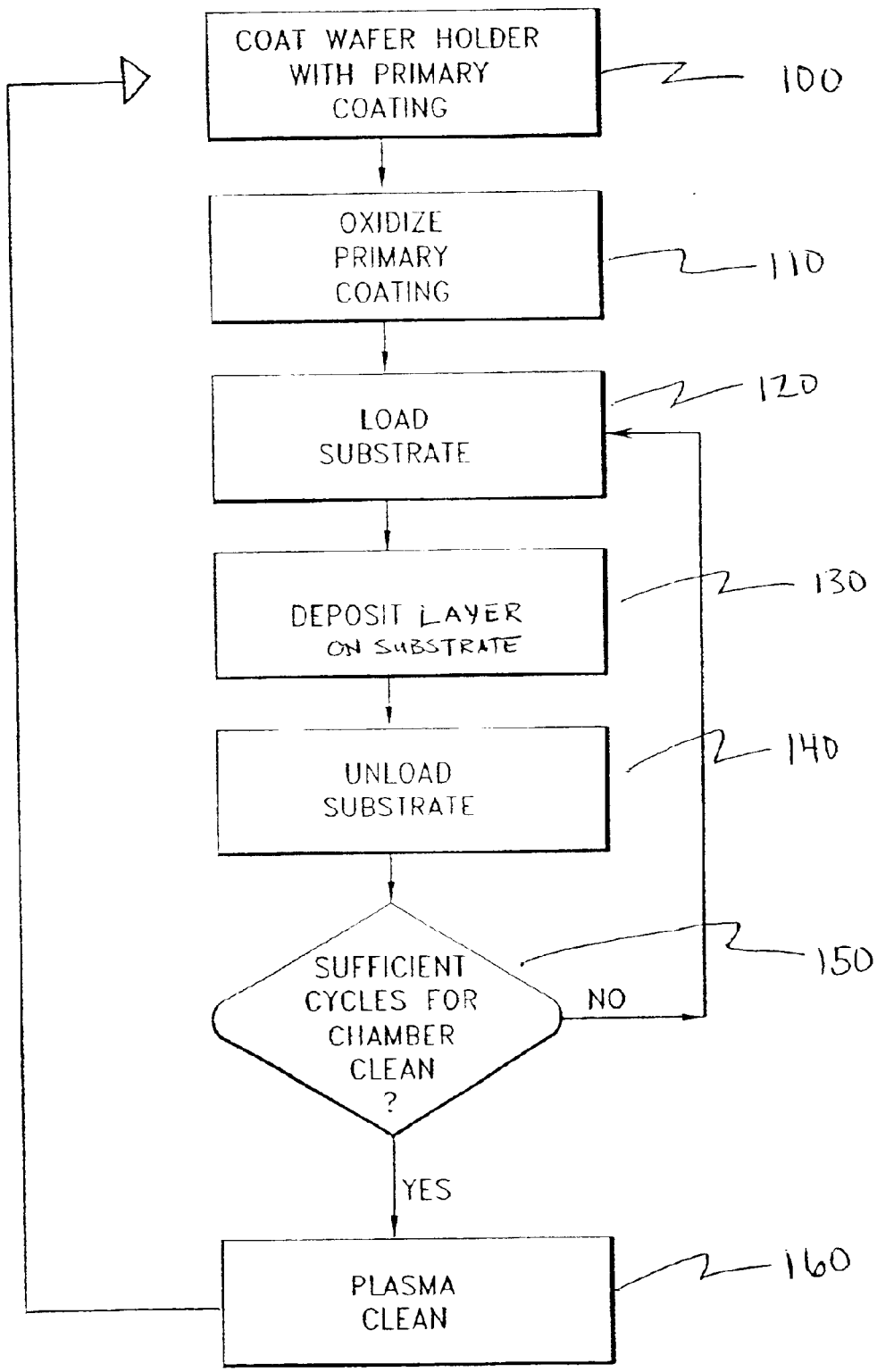
FIG. 3 is a flow chart illustrating a sequence for processing semiconductor substrates in accordance with a preferred embodiment of the invention.

FIG. 3 shows a general process sequence in accordance with a preferred embodiment of the present invention. As illustrated, semiconductor substrates are processed. Preferably, for depositing layers on semiconductor substrates, the susceptor (and attendant equipment, such as the slip ring) is coated 100 with a primary coating prior to loading of the substrate into the process chamber. The primary coating preferably has similar emissivity characteristics as the material to be deposited on the substrates, more preferably the same material is employed. In this way, the emissivity of the susceptor does not change significantly as deposited material builds on the susceptor while depositing on substrates. In the illustrated embodiment, where silicon nitride ($Si_3N_4$ or "SiN") is to be deposited on the substrate (s), the primary coating also comprises SiN. Coating 100 thus preferably comprises providing a silicon source gas and a nitrogen gas source, such as silane and ammonia, to the susceptor without a wafer on it. The primary coating preferably has a thickness between about 500 Å and 2.0 $\mu$m, more preferably between about 0.5 $\mu$m and 1.0 $\mu$m.

Preferably, the susceptor is coated with SiN using a thermal-mediated process. In an exemplary process recipe, the SiN coating is deposited using a susceptor temperature of about 775° C. and a pressure of 95 Torr. The nitrogen source is $NH_3$ provided at a flow rate of 4 standard liters/ minute (slm). The silicon source is $SiH_4$ provided at a flow rate of 40 standard cubic cm/minute (sccm). The carrier gas is $N_2$ and is provided at a flow rate of 5 slm. These conditions have been selected for thermal CVD of SiN in an EPSILON 2000® reactor, commercially available from ASM America, Inc. of Phoenix, Ariz. The skilled artisan will readily appreciate other suitable conditions and gas sources for thermal CVD of silicon nitride. In another embodiment, the susceptor is coated using a remote plasma generator in a plasma assisted CVD process.

Preferably, the primary coating is subjected to oxidation 110 prior to loading 120 substrate(s) into the process chamber. Oxidizing 110 the primary coating can be conducted by flowing an oxygen source over the primary coating. In thermal oxidation, the oxygen source is preferably selected from the group consisting of oxygen, nitric oxide and nitrous oxide, while the susceptor and slip ring are heated to a temperature preferably between about 600° C. and 1000° C., more preferably between about 650° C. and 850° C., and most preferably between about 750° C. and 800° C. for preferably between about 5 seconds and 2 minutes, more preferably between about 15 seconds and 45 seconds, and most preferably between about 25 seconds and 35 seconds. The oxidation preferably results in the formation of preferably between about 5 Å and 200 Å, more preferably between about 10 Å and 30 Å, and most preferably between about 10 Å and 15 Å of silicon oxynitride ($SiO_xN_y$) of the top surface of the primary coating. The skilled artisan will appreciate that excited oxygen species can alternatively be employed for oxidation. The oxidized silicon nitride coating is desirably more resistant to a plasma cleaning process, described in further detail below, and accordingly is less susceptible to asymmetric removal during the cleaning process. The silicon oxynitride coating thus serves to protect the underlying SiC and serves as a barrier of resistance to the plasma cleaning, which is able to remove the upper silicon nitride deposits resulting from the processing of substrates.

In one embodiment, the oxidation process is performed such that the primary coating is non-uniformly oxidized. Such non-uniform oxidation can compensate for preferential and asymmetric attack of the protective silicon nitride layer that overlies the silicon carbide coating in certain areas, such as the front of the slip ring 32 (which does not rotate during processing), due to non-uniform distribution of radicals in the reactor chamber during the removal of SiN deposits from the reactor components through the cleaning process. For example, the front portion of the slip ring 32 (FIG. 1) is positioned such that the high concentration of etch gases entering the reaction chamber through inlet port 40 contacts the front of the slip ring 32 and substrate holder 20 and then is dispersed throughout the reaction chamber. The front portion of slip ring 32 and substrate holder 20 encounters a higher concentration of etch gases and is preferentially attacked over the rear portions of these components. The substrate holder 20 continually rotates, such that the non-uniformity does not affect it as much as the slip ring 32. Such areas contacting a higher concentration of etch gases could benefit from a protective coating that is more etch resistant than the coating on areas such as the rear of slip ring 32, which receives a lower concentration of etch gases.

In one arrangement, temperature offsets in the heating control system are adjusted to provide higher temperatures at the front edge of components during oxidation 110, such that the primary coating is non-uniformly oxidized. In another arrangement, the flow of the oxidation is disturbed in certain areas by the injection of inert gases, such as helium or argon, in a directed manner to ensure non-uniform oxidation 110 of the primary coating. In another arrangement, non-uniformity of oxidation is achieved by oxidation performed by dispersing the oxygen source through the excited species generator 60 (FIG. 1), with or without the power on. As the front of the slip ring 32 is exposed to a higher concentration of etch gases, during plasma cleaning in this embodiment, the front portions are exposed to greater oxidation, resulting in greater oxynitride thickness, than the rear portions.

Following oxidation of the primary coating, the semiconductor substrate is loaded 120 onto the oxynitride-coated wafer holder and the substrate is processed. For example, a layer of silicon nitride is deposited 130 onto the wafer, and the processed substrate is removed or unloaded 140 from the semiconductor reactor.

A preferred application for the substrate processing is in the formation of a transistor gate dielectric. Further applications for the substrate processing are LOCOS hard masks and sidewall spacers for gate. For such applications, thin, uniform layers are preferred, such that plasma-assisted CVD is preferred. In an exemplary deposition process, the Si source is preferably silane and is provided at a flow rate of preferably between about 40 and 50 sccm. For a gate dielectric or portion thereof, the thickness of the layer of SiN on the substrate is preferably between about 10 Å and 50 Å and more preferably between about 15 Å and 30 Å.

After unloading 140 the substrate, at decision box 150 a determination is made as to whether sufficient cycles have been performed to form a chamber clean step. If the deposits on equipment are not removed, the build-up often leads to particulate contamination from flaking and non-uniform processing conditions. For example, the residue absorbs energy from radiant heat lamps and upsets the delicate balance in the relationship among heaters, temperature sensors, and placement of components in the chamber. To avoid flaking, the CVD chamber is cleaned, preferably before the deposits on the substrate holder and similar equipment are greater than about 20 $\mu$m in thickness, more preferably before the deposits are greater than about 2 $\mu$m in thickness, and most preferably before the deposits are greater than about 0.5 $\mu$m in thickness before etching. In the illustrated embodiment, wherein very thin silicon nitride layers are deposited for a gate dielectric application, cleaning is preferably performed after about every 5 to 1,000 cycles, more preferably after about 100 to 300 cycles. The skilled artisan will readily appreciate that, for other applications, the tolerance for maximum thickness before flaking becomes a problem will differ. For example, if very thick layers of silicon nitride are deposited in every cycle, a clean step may be performed every two or three cycles.

After processing one or more substrates, the chamber and components are then subjected to a periodic plasma cleaning 160. In a preferred embodiment, the plasma cleaning serves to remove SiN deposits that build up on chamber surfaces after processing a plurality of substrates. The silicon oxynitride coating on the wafer holder serves as a protective layer to protect the underlying SiC of the susceptor from the plasma etch gases used to clean the excess silicon nitride. The etch thus preferably stops on the protective layer and ensures that the chamber and components are maintained in an acceptable state for processing of successive semiconductor substrates.

Plasma cleaning 160 to clean the chamber surfaces of deposits before a successive substrate is loaded and processed preferably includes introducing corrosive vapor etchants into the chamber. In an exemplary process, the etchants are delivered through a remote excited species generator operating at 850 W into the chamber for a period of 15 seconds. The flow rate of NF3 is about 400 sccm and the flow rate of $Cl_2$ is about 200 sccm. More generally, the ratio of fluorine source to chlorine source (e.g., $NF_3$:$Cl_2$) flow rates is preferably between about 1:1 and 4:1 . Such etchants remove SiN and are selective against oxide. The resultant selectivity of the etchants for SiN over SiO may be expressed as an etch rate ratio of between about 20:1 and 40:1 (SiN:SiO). As will be appreciated by the skilled artisan, the selectivity against SiON is less than against SiO. Exemplary maximum etch rates for silicon nitride and silicon oxide are 3000 Å/min and 900 Å/min, respectively, for the given conditions.

Figure 4:
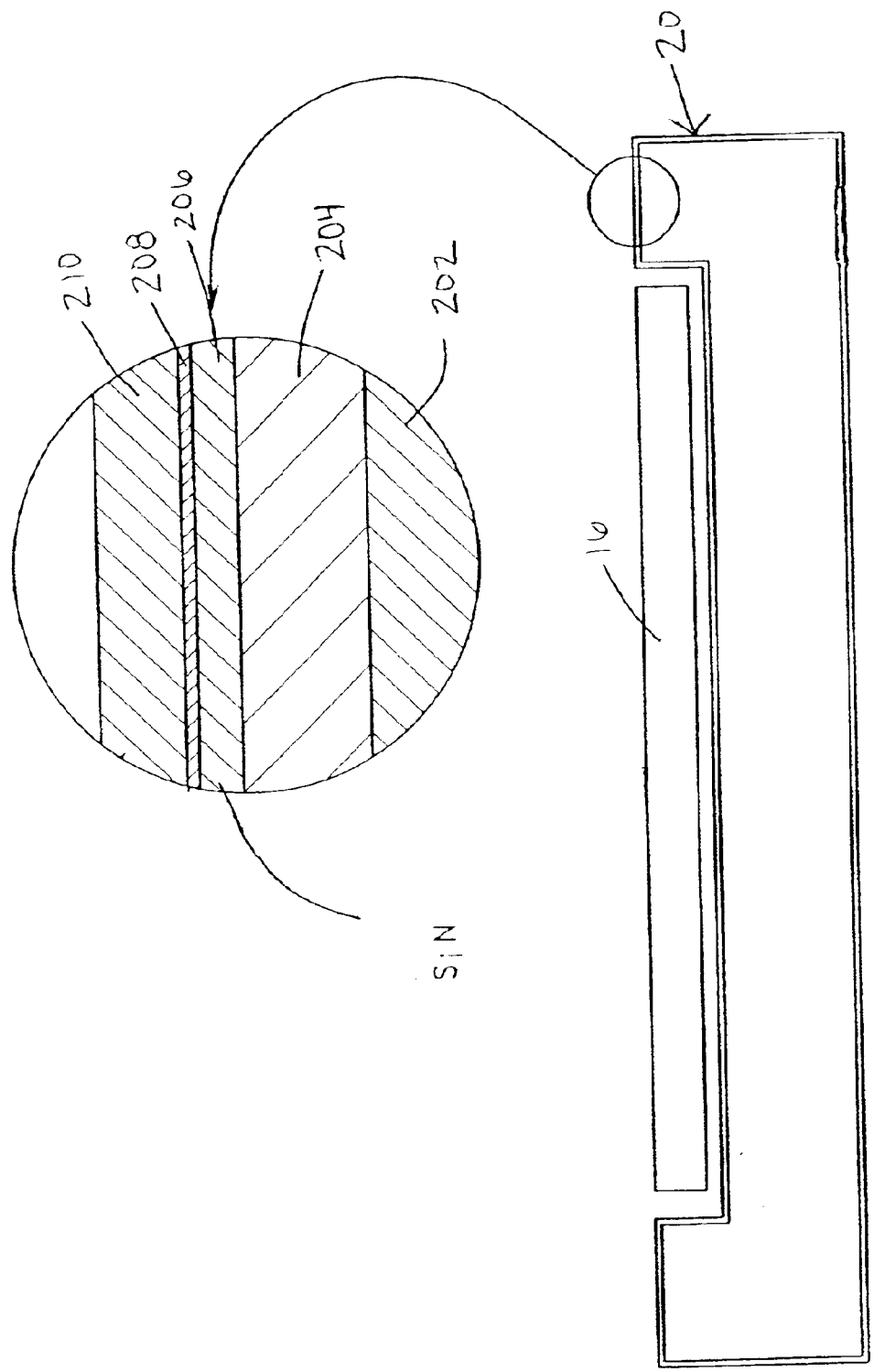
FIG. 4 is a schematic cross-section of a portion of a wafer holder, representing the upper surface of the wafer holder, in accordance with a preferred embodiment.

FIG. 4 illustrates a schematic cross-section of a portion of the preferred substrate holder 20 after processing of at least one substrate 16. In the illustrated embodiment, the susceptor or substrate holder 20 comprises a graphite core 202 with a sealing coating 204, preferably comprising silicon carbide (SiC). An emissivity-stabilizing coating 206 is shown with an overlying protective layer 208. The protective layer 208 is preferably an etch stop against selective etching of an overlying deposition build-up 210. In the illustrated embodiment, wherein the underlying layer 206 and overlying layer 210 comprise SiN, the protective layer 208 comprises a silicon oxynitride coating. The uppermost layer 210 comprises SiN that accumulates during the processing of the substrate, particularly during deposition SiN on multiple wafers in sequence.

Plasma cleaning 160, as noted, includes at least a phase in which silicon nitride is selectively removed from over a silicon oxynitride protective coating. Improved selectivity in this removal process ensures against nonuniform attack of the underlying silicon carbide coating. The process can stop at the silicon oxynitride protective layer, but more preferably etching is continued to remove the thin and uniform amount of the protective layer 208 and underlying primary coating 206. Because these layers are uniformly thin over the entire susceptor and because a residual amount of primary coating remains and serves to protect the underlying silicon carbide coating, nonuniformity in the plasma cleaning during this phase will not excessively harm the underlying silicon carbide coating.

After plasma cleaning 160, the chamber equipment, such as the wafer holder 20 and slip ring 32 is preferably coated again with the primary coating 100 (see FIG. 3), followed by oxidation 110 and a plurality of cycles 120–140 of deposition on different substrates in sequence.

The non-uniform manner by which the etch radicals are distributed onto the surfaces of the reactor chamber and components, particularly the susceptor and slip ring, has tended to cause damage to the underlying SiC coating. Methods and structures for achieving more etch resistant portions of the reactor chamber and components are described above.

It will be appreciated by those skilled in the art that various modifications and changes may be made without departing from the scope of the invention. For example, the skilled artisan will readily appreciate the silicon oxynitride protective coating can be used in other semiconductor processes involving plasma etch cleaning. All such modifications and changes are intended to fall within the scope of the invention, as defined by the appended claims.

We claim:

1. A method of preparing a substrate holder for deposition, comprising:

provding a substrate holder in a chemical vapor deposition chamber;

coating a silicon carbide (SiC) surface of the substrate holder with a primary coating of silicon nitride in the chamber; and oxidizing the primary substrate coating on the substrate holder prior to processing of substrates.

2. The method of claim 1 wherein coating the substrate holder with the primary coating comprises chemical vapor deposition of silicon nitride.

3. The method of claim 1 wherein coating the substrate holder with the primary coating comprises supplying a mixture of a silicon source gas and ammonia.

4. The method of claim 1 wherein oxidizing comprises flowing an oxygen source selected from the group consisting of oxygen, nitric oxide, and nitrous oxide.

5. The method of claim 1 wherein the primary silicon nitride coating has a thickness between about 500 Å and 2.0 μm.

6. The method of claim 1 wherein oxidizing forms between about 5 Å and 200 Å of silicon oxynitride.

7. The method of claim 1 wherein oxidizing comprises oxidizing the primary coating nonuniformly across a non-rotating component within the chamber.

8. The method of claim 7 wherein non-uniformly oxidizing comprises providing an inert gas to direct an oxygen source non-uniformly over the non-rotating component.

9. The method of claim 7 wherein non-uniformly oxidizing comprises adjusting temperature offsets.

10. A process of depositing silicon nitride, comprising:

providing an oxidized silicon nitride coating on a susceptor;

depositing silicon nitride on a plurality of substrates in sequence upon the coated susceptor; and plasma cleaning silicon nitride from the susceptor after depositing.

11. A method of processing semiconductor substrates, comprising:

preparing a susceptor by providing an emissivity-stabilizing coating over the susceptor and oxidizing the emissivity-stabilizing coating prior to processing of substrates;

loading a substrate onto the coated and oxidized susceptor;

depositing a layer of a material onto the substrate and at least portions of the susceptor;

removing the substrate from the susceptor after depositing; and plasma cleaning of the deposited material from the susceptor.

12. The method of claim 11 wherein the emissivity-stabilizing coating comprises silicon nitride.

13. The method of claim 11 wherein loading the substrate, depositing the layer of the material onto the substrate, and removing the substrate from the susceptor are repeated 5 to 1000 times prior to plasma cleaning.

14. The method of claim 13, wherein depositing the layer of the material comprises depositing 10 Å to 50 Å of silicon nitride on each substrate.

15. The method of claim 11, wherein plasma cleaning comprises providing etchant gases through an upstream excited species generator.

16. The method of claim 15, wherein plasma cleaning selectively removes silicon nitride from over silicon oxynitride.

17. The method of claim 15, wherein plasma cleaning is performed before the deposits are greater than about 2 μm in thickness.

* * * * *

UNITED STATES PATENT AND TRADEMARK OFFICE
CERTIFICATE OF CORRECTION

PATENT NO. : 6,825,051 B2
DATED : November 30, 2004
INVENTOR(S) : AmRhein et al.

It is certified that error appears in the above-identified patent and that said Letters Patent is hereby corrected as shown below:

Title page,
Item [56], References Cited, OTHER PUBLICATIONS,
"Muraka" reference, delete "(Jun. 1978)" insert -- (Jun. 1979) --.

Column 6,
Line 40, delete "$H_2ON_2O$" insert -- $H_2O$, $N_2O$ --.

Signed and Sealed this

Twentieth Day of December, 2005

JON W. DUDAS
*Director of the United States Patent and Trademark Office*